United States Patent [19]

Sukumar

[11] Patent Number: 5,539,316
[45] Date of Patent: Jul. 23, 1996

[54] SHIMMING METHOD FOR NMR MAGNET HAVING LARGE MAGNETIC FIELD INHOMOGENEITIES

[75] Inventor: Subramaniam Sukumar, Union City, Calif.

[73] Assignee: Bruker Instruments, Inc., Billerica, Mass.

[21] Appl. No.: 519,656

[22] Filed: Aug. 25, 1995

[51] Int. Cl.⁶ ........................................ G01V 3/00
[52] U.S. Cl. ............................. 324/320; 324/318
[58] Field of Search ........................ 324/300, 307, 324/309, 310, 311, 312, 313, 314, 318, 319, 320, 322; 128/653.2; 335/301, 216

[56] References Cited

U.S. PATENT DOCUMENTS

| | | | |
|---|---|---|---|
| 4,684,890 | 8/1987 | Briguet et al. | 324/309 |
| 5,012,217 | 4/1991 | Palkovich et al. | 324/318 |

Primary Examiner—Michael Tokar
Attorney, Agent, or Firm—Bookstein & Kudirka

[57] ABSTRACT

A method of shimming an NMR magnet uses a plurality of 1D projections through a sample volume to determine the inhomogeneities of the field of the NMR magnet. The frequency distributions obtained are assembled from the phase signals of the various projections. In order to avoid frequency errors due to phase wrapping, the phase of each signal is monitored over time for discontinuities indicative of aliasing. For each phase wrap, the signal is "unwrapped" by adjusting the value of the phase signal by $2\pi$. The same method is used to establish a shim field map for each of the shim coils being used. With one shim coil at a time being driven with a predetermined current, the detection method is repeated to acquire a shim-base frequency map for each shim coil. The base frequency map is then subtracted from the shim-base frequency maps to obtain shim field maps. The proper shim currents are then acquired through matrix operations on the shim field maps and the base frequency map.

11 Claims, 6 Drawing Sheets

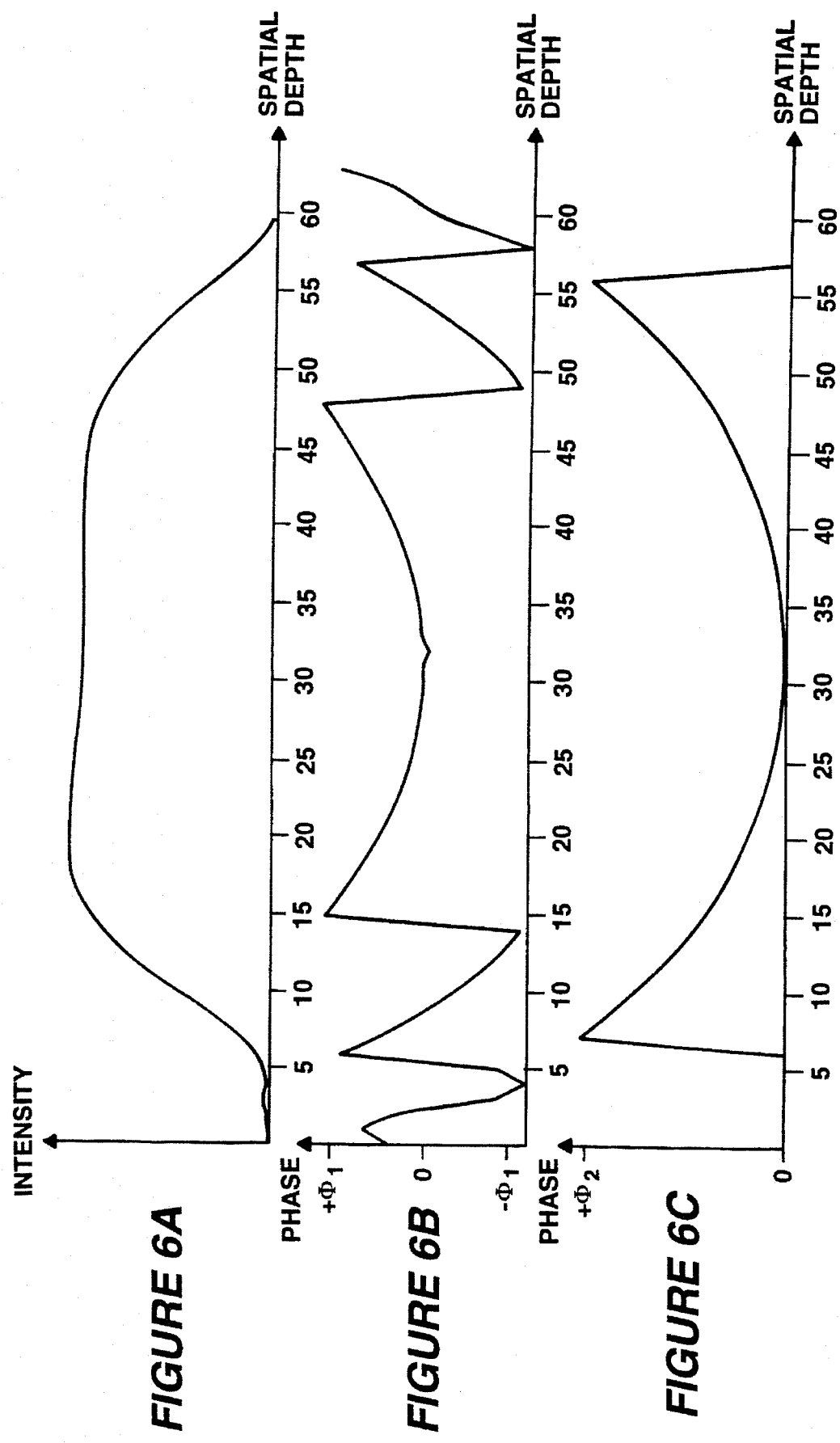

SHIMMING METHOD FOR NMR MAGNET HAVING LARGE MAGNETIC FIELD INHOMOGENEITIES

BACKGROUND OF THE INVENTION

1. Field of the Invention

This invention is related to nuclear magnetic resonance (NMR) techniques and, more specifically, to shimming the magnet of an NMR system to compensate for inhomogeneities in the field of the magnet.

2. Description of the Related Art

A homogeneous magnetic field is critical for NMR experiments. Imaging experiments such as gradient echo-based techniques, localized spectroscopy and echo-planar imaging are a few experiments that can fail if the homogeneity of the magnetic field within a sample being tested is poor. While spin-echo imaging is more tolerant of inhomogeneities, a homogeneous magnet will nonetheless give better results.

In conventional NMR systems, the field of the magnet is "shimmed" by placing appropriate "shim" currents through shim coils located at various positions relative to the field of the magnet. As appropriate currents are passed through the shim field coils, they produce characteristic fields which compensate for the inhomogeneities of the magnet. However, achieving the appropriate characteristic fields in the shim coils often requires adjusting the current through the coils manually. This procedure can be tedious and time-consuming. In high-resolution systems, it is not unusual to shim a magnet for hours, or even days, to achieve a certain homogeneity specification. This procedure can be automated by employing a simplex procedure, but that too can be time consuming, and may not always give the optimum results.

A more analytical solution to the problem is to determine the inhomogeneous field distribution of the magnet, and calculate the currents of the shim coils necessary to compensate for the inhomogeneities. The field of the magnet can be measured by using a small NMR probe which is moved through the magnetic field by a special mechanical device. However, this method is also time-consuming. Furthermore, the probe itself causes a distortion in the field, and the measurement does not correspond to the actual field that would influence a sample being tested.

A number of automated shimming procedures have been reported which make use of NMR imaging. These methods are beneficial because: 1) the field measurements are done while a sample of interest is present in the field of the magnet, and the field inhomogeneity seen by the sample is directly measured and compensated for; 2) knowing the field or frequency distribution within the sample allows the specification of an arbitrary shimming region of interest; 3) shim field maps are calibrated using the same measurement methods and, therefore, and misregistration in the image caused by misalignments, non-linearities and imperfections in the gradient or shim coils are self-compensated; and 4) the shimming procedures can be fully automated.

There are two basic approaches to measuring frequency or field distribution within a sample of interest: direct frequency measurement methods using spectroscopic imaging techniques; and image based methods in which frequencies are evaluated from the complex image data that is detected.

Frequency measurements based on localized spectroscopy have been described which are analogous to a mechanical point-by-point frequency measurement method. These methods are difficult to perform because they are prone to artifacts caused by eddy currents and signal contribution from outside the selected region of interest. If multiple resonances are present, the voxel or slice selection can be complicated by partial volume or chemical shift effects.

A frequency mapping method based on Chemical Shift Imaging (CSI) uses an RF pulse followed by a set of three nested phase-encoded gradient pulses, after which a signal is acquired. A four-dimensional (4D) Fourier transform is then used to directly obtain the frequency distribution within the sample. A primary disadvantage with this method is that data acquisition times are particularly long due to the use of three phase encoded gradients. Typically, the frequency measurement within each voxel is obtained by analyzing the lineshape. However, this analysis can be more complicated if overlapping resonances are present, in which case post processing of the data is often needed because of complicated line shapes and phase anomalies.

Of the image-based techniques, the gradient echo method has the advantage that the pulse flip-angle can be made short so that the sequence can be repeated with a short recycle time, thereby improving the efficiency of the method. Echo-planar imaging (EPI) is an image-based technique which can reduce the data acquisition time by a factor of about N, where N is the size of one of the phase encoded dimensions. However, the EPI method is extremely sensitive to eddy currents caused by the pulsing of large gradients and also to field inhomogeneities, and special gradient hardware is needed.

It has been shown that the analysis of field maps for shimming can be done by collecting a few one-dimensional (1D) projections instead of an entire three-dimensional (3D) dataset. This method has been demonstrated with a gradient echo imaging method and with a stimulated echo method. The method results in a significant saving in data acquisition times, making it useful for clinical and other applications where fast shimming methods are required. However, these echo methods rely on the frequency shift between images acquired at two different echo times which is, presumably, caused by inhomogeneities in the magnetic field. If the inhomogeneities are too great, a phase wrap occurs between the two echo images, and aliasing results, making frequency measurement impossible. Large inhomogeneities can also lead to signal loss due to dephasing of the spins and severe image distortions.

The subtraction of two phase images to acquire a frequency distribution (as described above) gives a result which is a modulo $2\pi$ radian value. Thus, any phase change greater than $2\pi$ radians is wrapped (i.e., aliased) in the phase image, and results in discontinuities at the $2\pi$ boundaries. If the phase wrapping goes uncorrected, the shim calculations can fail due to errors in the frequency measurement. Previous approaches to the phase wrapping problem include avoiding the problem by keeping the delay between the echo times short enough that the spins do not accumulate a phase change greater than $2\pi$. However, this approach may not be reliable when dealing with high-field systems. The use of higher order shims and large susceptibility effects at these fields usually cause large field gradients in the sample, resulting in phase wraps.

SUMMARY OF THE INVENTION

In the preferred embodiment of the present invention, the inhomogeneities of the magnetic field of an NMR magnet are determined by taking a finite number of 1D projections of the sample volume. The preferred number of projections is nine, three along the principal axes of the volume, and six along the major diagonals of the volume. The free induction decay signals for each of the chosen projections are detected at two times, $T_1$ and $T_2$. These time-domain signals are then Fourier transformed with respect to the phase encoding dimension. To acquire the phase of the signals, the frequency (spatial) domain signals are converted from Cartesian coordinates to polar coordinates.

Because the phase signals may be phase wrapped, the present invention monitors the spatial-domain phase signals. At the point where phase wrapping occurs, $2\pi$ (360°) is added (or subtracted) to (or from) the absolute phase of the signal in question. Once all of the phases (for a particular gradient direction) are unwrapped in this way, the frequency distribution for that gradient direction is obtained by dividing the difference between the unwrapped phase signals by the time difference between $t_2$ and $t_1$. The frequency distribution for each of the gradient directions thus being obtained, the appropriate compensatory shim fields may be applied.

Predetermined shim currents may be applied to compensate for the detected inhomogeneity-induced frequency distribution. However, the method of the present invention may also be used to calculate both the effect of each actual shim coil on the inhomogeneous volume, as well as the appropriate shim currents to compensate for the inhomogeneities. For each of the shim coils, the following procedure is used to obtain the "shim-base" frequency map (i.e., the frequency map indicating both the effect of the magnet inhomogeneities as well as the effect of the magnetic field of the shim coil).

A nominal current is passed through the shim coil and the resulting frequency distribution is measured using the method described above for each of the same gradient directions as used for measuring the base frequency distributions (i.e., the distributions detected when all shim currents are at their nominal values). Once these shim-base distributions are acquired, the base frequency distributions, already acquired, are subtracted from the shim-base distributions, resulting in a "shim" frequency distribution for each of the gradient directions. These shim distributions represent the effect of the shim coils on the sample volume in the absence of the detected inhomogeneities.

Once the shim distributions are obtained, the appropriate shim currents may be acquired by matrix algebra. Specifically, determining the components for a vector v which minimizes the term $A \cdot v - b)^2$, where A is a matrix containing the shim frequency distributions and b is a vector containing the base frequency distributions, gives the optimum shim currents.

An alternative embodiment of the invention involves obtaining the frequency value for each of the spatial points of a distribution without transforming the detected time-domain signals into the frequency (spatial) domain. The time-domain signals are detected for each of the spatial points, and the phase of each signal is obtained as described above. However, to obtain the frequency value, the time-based derivative of the phase signal is taken over the full temporal range of the signal for the spatial point in question. Since the change in frequency will be constant with time, the derivative of the phase signal is a constant value representative of frequency. Although phase wrap results in discontinuities in both the phase signal and the frequency signal, as does the eventual overtaking of the signal by ambient noise, these discontinuities are brief deviations from the otherwise constant frequency value. As such, they may be removed as artifacts, and the overall average value of the phase derivative accurately represents the frequency.

BRIEF DESCRIPTION OF THE DRAWINGS

FIGS. 6A–6C depict the intensity, wrapped phase and unwrapped phase signals, respectively, for a particular frequency distribution.

DETAILED DESCRIPTION OF THE PREFERRED EMBODIMENTS

Figure 1:
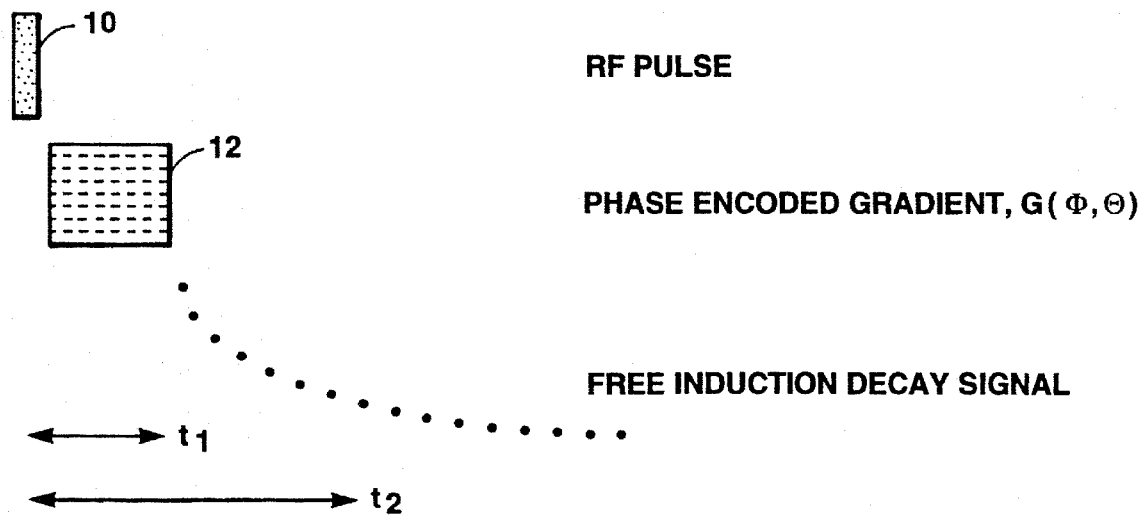
FIG. 1 is a graphical depiction of the pulse sequence used with the present invention.
Figure 2:
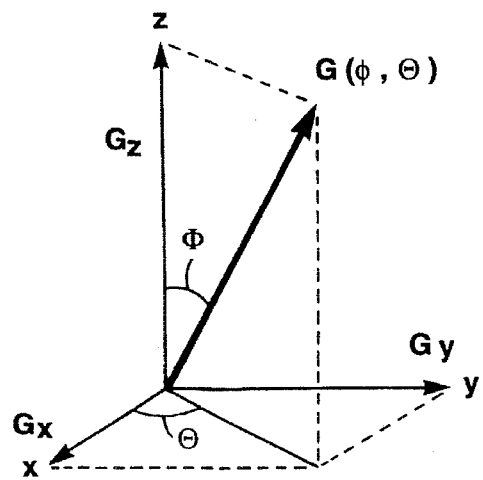
FIG. 2 is the phase encoded gradient direction with respect to a set of x, y and z axes.

FIG. 1 is a graphical depiction of the pulse sequence used with the present invention. Located within the field of a magnet to be shimmed is a sample material. The spins of nuclei within the sample are excited by an initial RF pulse 10, which is preferably less than 90° so that the sequence can be repeated rapidly without saturating the spins. A phase encoded gradient pulse 12 is then applied along a particular direction, labeled as $G(\Phi,\Theta)$ in the graphical plot of FIG. 2. Relative to the coordinate axes of the FIG. 2 plot, the gradient amplitudes for the gradient pulse 12 are:

$G_x = G \sin\Phi \cos\Theta$ $G_y = G \sin\Phi \sin\Theta$ $G_z = G \cos\Phi$

The phase encoded gradient is stepped from a positive value to a negative value along the $G(\Phi,\Theta)$ direction. If the spatial axis along that direction is designated r, temporal points $t_1$ and $t_2$ may be defined which correspond to two different times at which a free induction decay (f.i.d.) signal is detected along the r axis. These two points in time are shown graphically in FIG. 1, and the value of the f.i.d. signal at these times may be represented by $s(t_r)_1$ and $s(t_r)_2$ respectively. If these two signals are Fourier transformed with respect to the phase encoding dimension $t_r$, two 1D projection images ($S(r)_1$ and $S(r)_2$, respectively) along the direction $G(\Phi,\Theta)$) are obtained.

A difference between the two projections, caused by the effect of the evolution of spins in the inhomogeneous field of the magnet during the time between $t_1$ and $t_2$, is detectable. For the purposes of the present invention, the phase profile of the two projections is calculated by converting the data, S(r), from Cartesian to polar coordinates. This conversion is done using the equation:

$P(r) = \arctan(S(r)_{im}/S(r)_{re})$ where $S(r)_{im}$ is the imaginary portion of the complex Fourier transformed image data and $S(r)_{re}$ is the real portion of that data. Thus, for the signals $S(r)_1$ and $S(r)_2$, respectively, $P(r)_1$ and $P(r)_2$ are acquired, and refer to the phase of the signals. The frequency distribution along direction $G(\Phi,\Theta)$ is then obtained by calculating:

$$F(r)_1 = (P(r)_2 - P(r)_1)/(t_2 - t_1)$$

This frequency distribution is a direct reflection of the inhomogeneity along the gradient direction $G(\Phi,\Theta)$.

In the preferred embodiment of the invention, the frequency distributions along other gradient directions through the sample volume are also acquired in the manner described above. Specifically, the preferred embodiment uses nine different gradient directions: the principal x, y, and z axes of the coordinate reference frame; and the six diagonal axes xy, −xy, xz, −xz, yz, and −yz (where, e.g., xy is the direction at 45° with respect to x in the xy plane, and −xy is the direction at 135° relative to x in the xy plane). Each of the frequency distributions is acquired by the same set of steps, which is summarized in FIG. 3.

Following the phase-encoded pulse in the first direction, time-domain signals $s(t_r)_1$ and $s(t_r)_2$ are detected during the f.i.d. of the sample spins (step 20). These signals are then Fourier transformed into the frequency domain to obtain two projection images along the particular gradient direction of interest (step 22). The image data is then converted from Cartesian to polar coordinates (step 24). Because these "wrapped" phase images may suffer from aliasing, it is necessary to "unwrap" them (step 26). In the preferred embodiment, the phase unwrapping is achieved in the manner described hereinafter. Once the phase images are unwrapped, the field map may be generated (step 28). This map provides a reasonable approximation of the various inhomogeneities in the field of the NMR magnet.

A modification of the field detection method described above may also be used for generating a shim field map for each of the shim coils. A method for calculating a shim field map is depicted in the flow diagram of FIG. 4. First, a shim current, $I_s$, is passed through the shim coil for which a field map is being generated (step 30). Then, a "shim-base" field map, $F_{SB}$, is generated using the method of FIG. 3 (step 32). The base field map, $F_B$, 34 (i.e., the map detected when all shim currents are set to their nominal values) is then subtracted from the detected field map $F_{SB}$ to provide a shim field map, $F_S$ (step 36). This shim field map is representative of the effect of the shim coil on the sample volume in the absence of magnet inhomogeneities.

Figure 4:
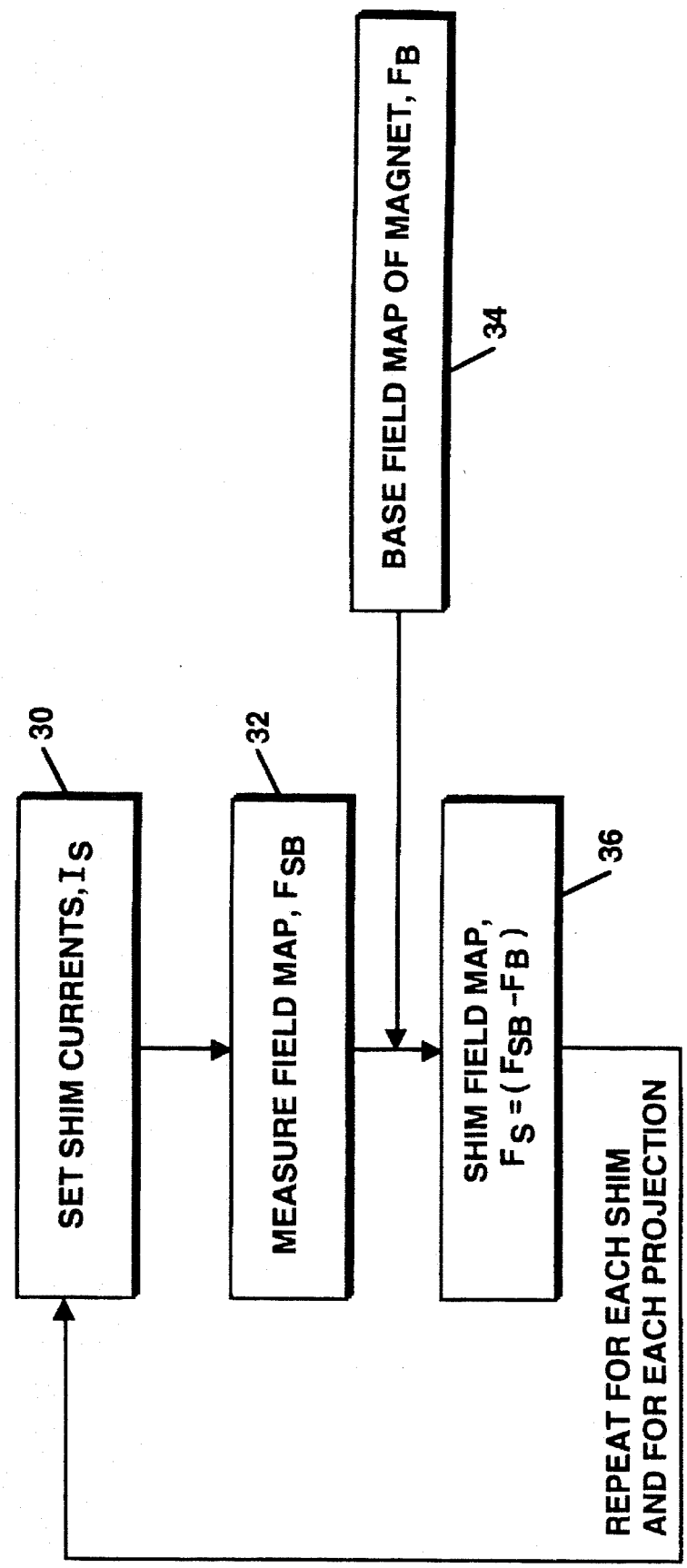
FIG. 4 is a flow diagram depicting the steps for determining the shim field distributions for shim coils used for shimming an NMR magnet

While FIG. 4 shows a single sequence of steps, those skilled in the art will understand that, for each shim coil, a field distribution must be determined for each of the projection directions (nine in the preferred embodiment). Since the same projections are used in measuring each shim-base field map, $F_{SB}$, as are used in the generation of the base field map, $F_B$, generating each shim field map 42, $F_S$, is simply a matter of subtracting $F_B$ from $F_{SB}$. Once the shim field map is determined for a particular shim coil, the current through that coil is discontinued, and the procedure is repeated for another shim coil. This process continues until a shim field map has been developed for each of the shim coils.

Figure 5:
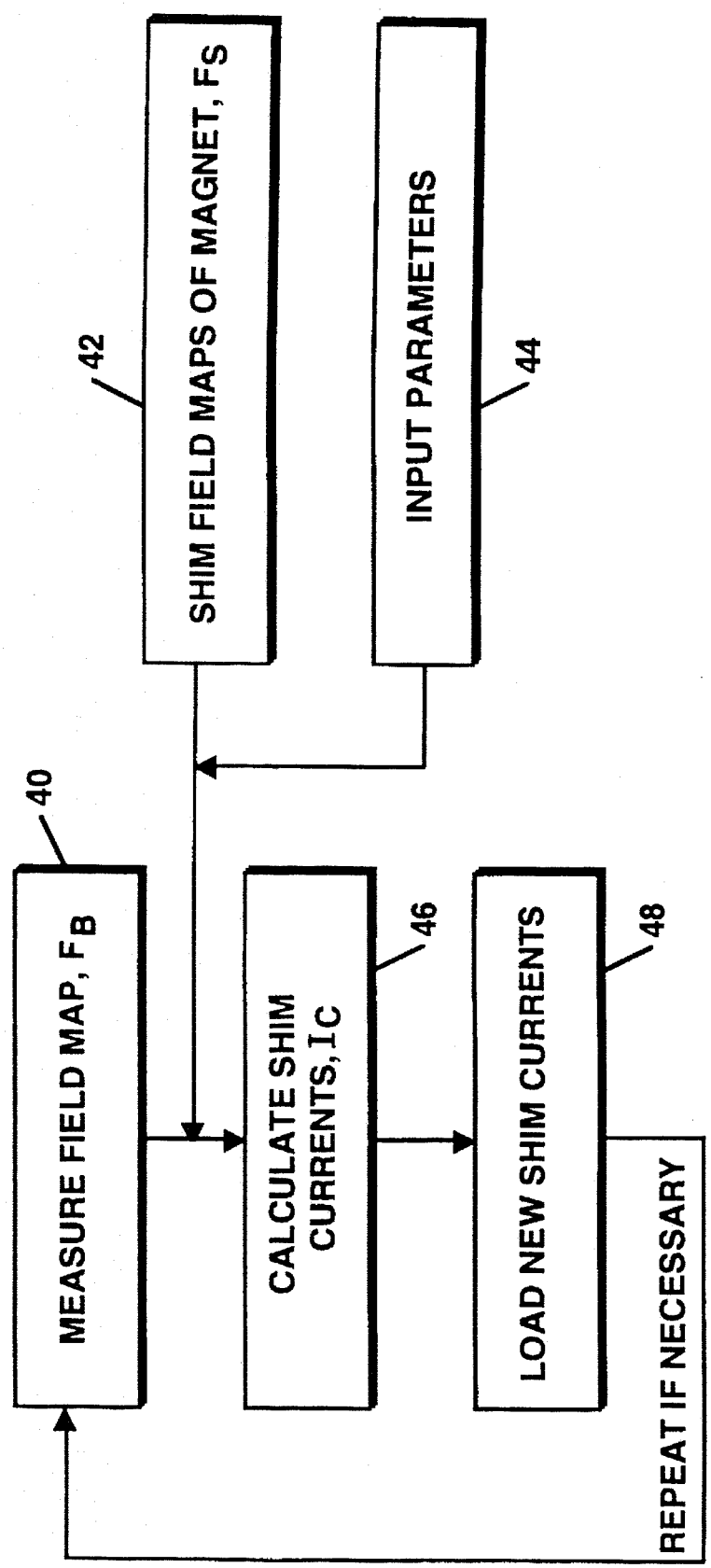
FIG. 5 is a flow diagram depicting the steps for determining the appropriate shim currents for shimming an NMR magnet.

The overall shimming method is depicted in the flow diagram of FIG. 5. First the base field map $F_B$ is measured (step 40). The shim field map $F_S$ 42, along with the appropriate input parameters 44 are used in combination with the base field map $F_B$ to obtain the shim currents (step 46) for compensating for the magnet field inhomogeneities. The shim currents are then supplied to the coils (step 48) and the process repeated, if necessary.

The input parameters are various numeric values which, while generally remaining constant during one particular shimming process, may be changed for shimming under other conditions. These parameters include: the shim coil currents used during the generation of the shim field maps; the time delay between the temporal points $t_1$ and $t_2$; the threshold level for rejecting noisy signals; and the number of projections used. In variations of the shimming technique, other parameters may be varied between iterations of the same shimming procedure (each iteration being one calculation or recalculation of the shim currents during the same shimming process). For example, the number of shim coils used in the calculation might be increased in subsequent iterations. In another variation, the shimming procedure may begin with a localized region of the sample volume, and expand during subsequent iterations.

For a shimming procedure during which the input parameters remain constant, the shim field map and the base field map are used to determine the appropriate currents for the shim coils. From each of the 1D field maps (i.e. p projections), a total of m data points above a certain intensity threshold are taken and placed in a column vector b. The threshold is used because data points below the threshold will be dominated by random fluctuations in the phase of the noise, which can cause large errors in the frequency measurement. Similarly, the spatially-equivalent m points are taken from each of the normalized shim field maps (i.e., normalized relative to the currents used to generate the shim-base field maps) which may be found by dividing the shim field maps, $F_S$, by the shim currents, $I_s$, used during measurement of the shim-base distributions. Each of these sets of m points are placed in a vector of size m, and these vectors (one for each of c shim coils) are assembled into a matrix A of size c×m.

The calculation of the appropriate shim currents then makes use of the well-known least squares problem:

$$\text{minimize } (A \cdot v - b^2)$$

in which v is a vector that corresponds to the shim current values. The optimum shim current values, $v_o$, are the values for v which minimize the argument of the above least squares equation, and may be found using known matrix methods.

The shim currents are preferably calculated using an available algorithm (such as the function "SVDCMP" described in Section 2.6 of W. H. Press, et al., *Numerical Recipes in C*, Cambridge University Press) to perform a "Singular Value Decomposition" on the data in vectors A and b. Such algorithms are well known in the art and can perform the necessary matrix algebra to minimize the least squares argument in the most efficient way.

As shown in FIG. 5, the process of obtaining the optimum shim currents may require several iterations. With each iteration, the base field map is remeasured, and the shim currents are recalculated. The compensation provided to the field of the magnet by the shim coils improves with each iteration until "convergence" is achieved. In this case, convergence may be identified by the failure of the compensation to improve any further. At this point, the shim current values have been optimized.

As mentioned above, the problem of phase wrapping can introduce severe errors into an echo-based image system. Because this method is image-based, the frequency is calculated by subtracting two phase images corresponding to the points sampled at $t_1$ and $t_2$. The phase calculated in this manner gives a modulo $2\pi$ radian value. Therefore, any phase change greater than $2\pi$ radians would ordinarily be aliased or "wrapped" in the phase image, resulting in discontinuities at the $2\pi$ boundaries (although, if the phase is calculated using the atan function in "C" programming language, the value returned will be within $\pm\pi$ radians, and the discontinuities will occur at the $\pm\pi$ boundaries).

If the phase transition boundaries are not determined, the shim calculations will fail due to errors in the frequency measurement. The present invention "unwraps" the phase images by monitoring the change in the phase $(d\phi/dr)$ along the spatial dimension to detect phase jumps, and adding the appropriate phase compensation to the phase-detected signal.

FIGS. 6A–6C show the phase change across a profile in the z-direction caused by a $z^2$ shim coil. In FIG. 6A, the magnitude of the spin density along the z-direction is shown. Since each of the units on the horizontal axis of FIG. 6A represents a single data point, there is a total of sixty-four data points, with the thirty-second data point being the approximate center of the magnetic field distribution.

In FIG. 6B is shown the corresponding phase of the signal of FIG. 6A. At the $\pm\pi$ boundaries, sharp discontinuities exist in the phase of the signal due to phase wrapping. Without correction, the frequency measurement will contain errors resulting from these phase jumps. In the preferred embodiment, once the phase jumps are detected, the phase is adjusted by $2\pi$ radians (360°) at each point of discontinuity. That is, if the phase is a positive value at the point of discontinuity, $2\pi$ radians are added to the recorded phase signal. If the phase is a negative value at the discontinuity, $2\pi$ radians are subtracted from the phase value. Thus, as adjusted, the phase signal is continuous from a minimum phase value to a maximum phase value. A representation of an unwrapped phase signal is shown in FIG. 6C.

Typically, the phase boundaries are at $\pi$ and $-\pi$, or at 0 and $2\pi$, although it depends on the detection method being used. Phase evaluation software programs are typically used in these circumstances, and the detection method may make use of either boundary set. In the preferred embodiment, the phase discontinuities are detected by detecting deviations in the phase signal from one data point to the next which exceed a predetermined threshold. The threshold (e.g., $\pm\pi$) is set to a level higher than any anticipated phase change due to inhomogeneities, but low enough so as not to encompass any phase wrapped values. When the threshold is exceeded (in either the positive or negative direction), the value which exceeds the threshold is adjusted by either $-2\pi$ or $+2\pi$, depending on which adjustment brings the value back within the threshold range. Since the phase wraps which occur are unusually large jumps in the detected phase, they are easy to distinguish from ordinary phase changes.

The unwrapping of the phase may be performed before or after the difference between the phase distributions is taken. That is, a wrapped phase difference signal $P_w(r)_D = P_w(r)_2 - P_w(r)_1$ may be found before phase unwrapping, which has detectable phase discontinuities due to the phase wrapping. The phase may then be unwrapped by adjusting the value of the phase difference signal. Since phase wrapping may also result from the subtraction of the two phase images, the result of the subtraction should also be monitored to correct the value of the phase if a phase wrap is indicated.

The true phase of the signal can be predicted more easily by sampling more points between $t_1$ and $t_2$ (the "true" phase referring to the unwrapped phase, in which the phase is continuous from a negative value to a positive value with no modulo $2\pi$ repetition). Using the method of the present invention, the phase variation will be linear and the slope, $d\phi/dt$, gives the frequency. The relationship of these signals is demonstrated by FIGS. 7A–7C.

Figure 7A:
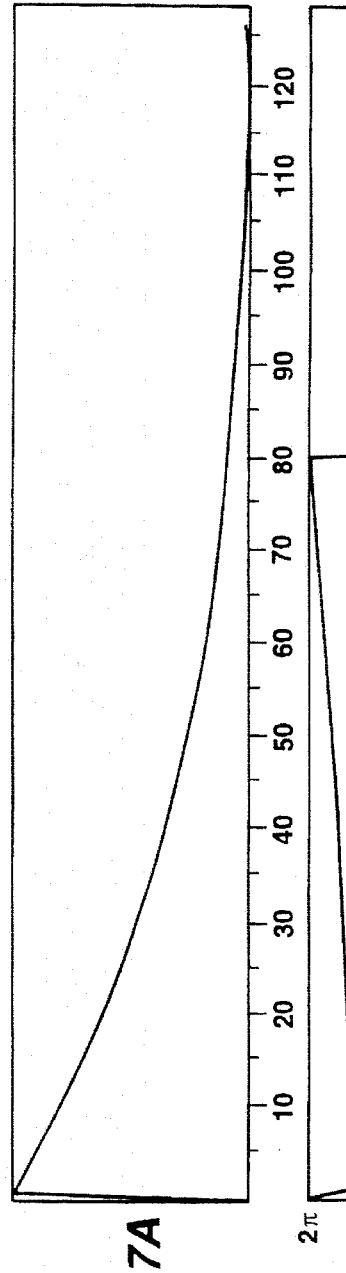
FIGS. 7A–7C depict the time domain intensity signal, the time domain phase signal, and the derivative of the time domain phase signal, respectively, for a particular spatial point in the sample volume.

FIG. 7A depicts the intensity of a complex time domain signal from a single spatial point measured by the method of the present invention. The free induction decay of the spin at that point causes the signal intensity to decrease over time. If using a sufficient number of data points, the phase of the signal can also be detected. For a given spatial point, the phase of the signal changes linearly as the signal decays, that is, the phase change with time, $d\phi/dt$, is a constant. This change is demonstrated by the graph of FIG. 7B, which shows the change in phase with time of the spatial point of FIG. 7A.

Figure 7B:
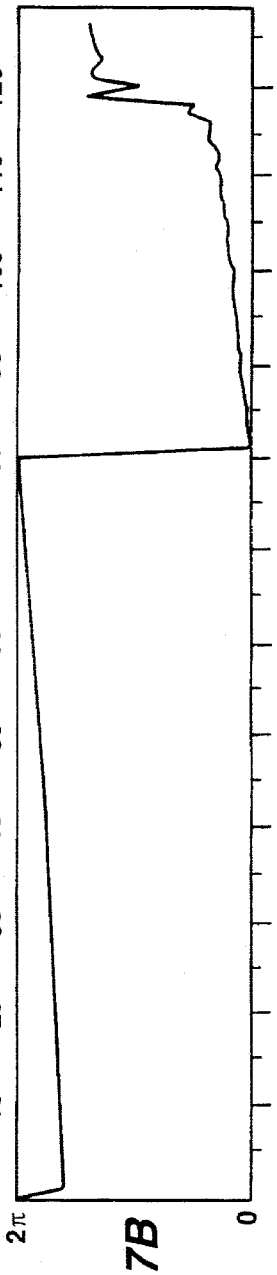

As shown in FIG. 7B, the phase of the signal crosses $2\pi$ at approximately 80 milliseconds into the measurement. At that point, the phase jumps to 0, and continues on its linear track, until it finally begins to break up due to distortion. In the method described above, it is necessary to monitor discontinuities such as this one to avoid errors in the frequency measurements due to incorrect phase values. Monitoring the time-domain phase signal of FIG. 7B is one way of tracking the phase. However, as described below, in an alternative embodiment of the invention, this signal may also be used for directly acquiring the desired frequency information.

Figure 7C:
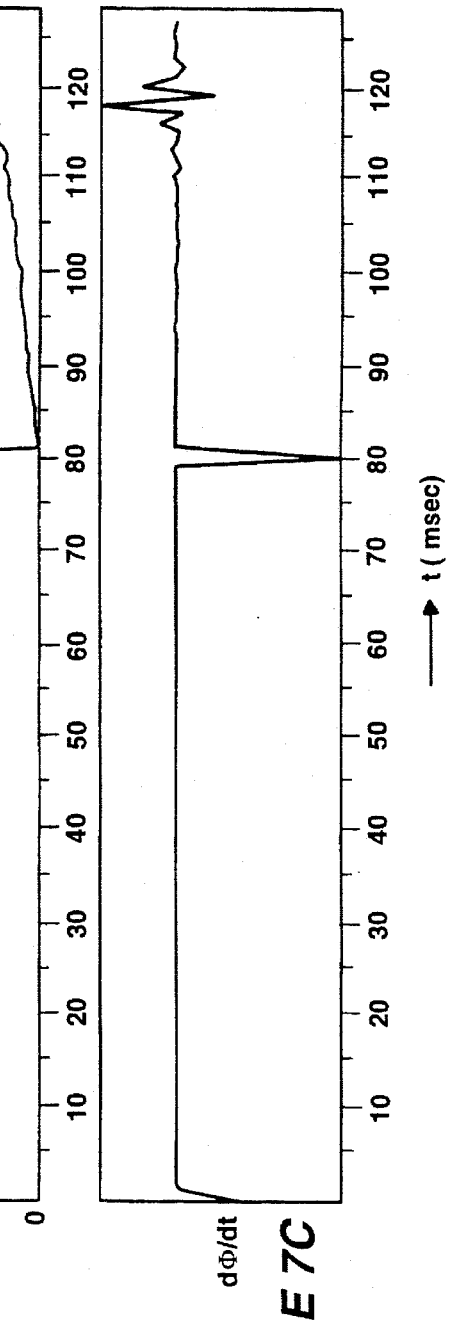

The derivative of the phase, $d\phi/dt$, is representative of the frequency. As such, the derivative of the time domain phase measurement may be used to ascertain an accurate value of the frequency. FIG. 7C depicts the change with time of the frequency $d\phi/dt$ of the signal of FIGS. 7A and 7B. As shown in this figure, the frequency is a constant value, except at the point of the phase wrap, and after the signal intensity decays to the point that noise causes distortion of the phase measurement. The phase wrap causes sharp jumps in the value of $d\phi/dt$. However, because these jumps are so far from the normal, constant value of the frequency, they can be removed as artifacts. By removing these artifacts, and those resulting from the discontinuities in the phase as the signal begins to decay, the average value of $d\phi/dt$ can be acquired, and is representative of the frequency value for that single spatial point.

Collecting the frequency values in the manner described immediately above, allows the step of performing a Fourier transform on the time domain signal to be omitted. In general, it is assumed that the phase is a slowly varying function along the spatial dimension, and that the phase change between two adjacent pixels is less than $2\pi$ radians. It is for this reason that a threshold is used to screen out frequency signals below a particular signal to noise level since, if the signal to noise ratio is poor, large phase fluctuations can result.

Since the phase wrap condition is estimated on each voxel of interest (by evaluating $d\phi/dt$), it is therefore independent of the phase of neighboring voxels. Thus, problems related to frequency measurement involving noisy voxels that are adjacent to the voxel of interest do not arise. However, when omitting the Fourier transform step as described herein, samples with multiple resonances can not be used, since the phase changes caused by chemical shift are indistinguishable from those caused by field inhomogeneities.

Figure 3:
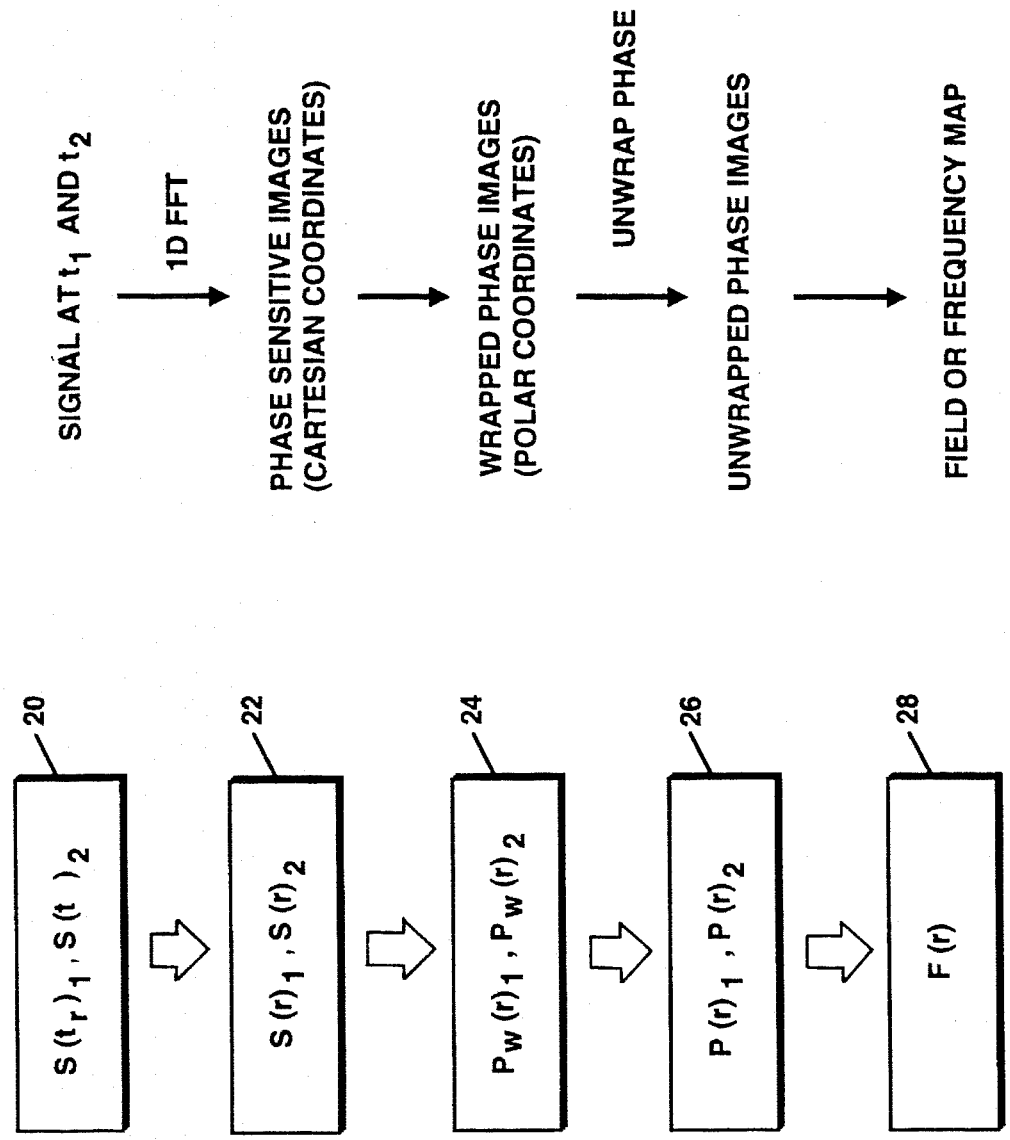
FIG. 3 is a flow diagram depicting the steps for determining the field inhomogeneities of an NMR magnet.

Using the method of FIG. 3, a two-dimensional dataset can be obtained. After a 2D Fourier transform, a chemical shift image is obtained along the direction $G(\Phi,\Theta)$. The frequency information can then be obtained directly from the frequency domain even if multiple resonances are present. Those skilled in the art will recognize that when particularly large inhomogeneous effects are present, they may cause distorted lineshapes that are difficult to phase resolve, particularly if multiple lines are present. In such a case, more elaborate lineshape analysis may be needed to resolve the resonances and estimate inhomogeneity related frequency shifts.

The present invention provides a significant saving in data acquisition times. In a conventional CSI experiment, the phase encoded gradients are applied along the x, y, and z directions, thereby requiring a minimum of $(N_x)(N_y)(N_z)$ scans, where N is the number of phase encoding steps for each of the three directions. For gradient shimming of systems with large inhomogeneities, a large signal loss can be expected due to dephasing of spins during the phase encoding period. It is therefore desirable to keep the phase encoding period as short as possible. In the present invention, the number of scans is reduced to N×p, where N is the number of phase encoding steps and p is the number of projections (p being equal to nine in the preferred embodiment). The signal-to-noise ratio achieved using the present invention is also higher than that of a signal acquired with the gradient echo methods because: the signal is acquired in the absence of a gradient; the signal can be evaluated by summing the frequencies of the oversampled data between $t_1$ and $t_2$; the spatial dimensions correspond to 1D projections of the signal; and each projection requires multiple scans for phase encoding.

While the invention has been shown and described with reference to a preferred embodiment thereof, it will be understood by those skilled in the art that various changes in form and detail may be made therein without departing from the spirit and scope of the invention as defined by the appended claims.

What is claimed is:

1. A method of determining the inhomogeneities in the magnetic field of a magnet which generates a magnetic field in a region containing a sample material, the method comprising:

A) generating an RF magnetic pulse which is incident on the sample material;

B) generating a phase encoded gradient pulse in a gradient direction which is incident on the sample;

C) detecting a first set of free induction decay signals $s(t_r)_1$ corresponding to a plurality of spatial points in the sample at a first time $T_1$;

D) detecting a second set of free induction decay signals $s(t_r)_2$ corresponding to said plurality of spatial points in the sample at a second time $T_2$;

E) transforming $s(T_1)_1$ and $s(T_1)_2$ from the time domain to image signal sets $S(r)_1$ and $S(r)_2$ in the frequency domain;

F) converting $S(r)_1$ and $S(r)_2$ to polar coordinate signals $P_w(r)_1$ and $P_w(r)_2$, respectively;

G) for each of $P_w(r)_1$ and $P_w(r)_2$, detecting a change in phase at each of a plurality of spatial points relative to a phase of a next previously detected point and, when said change in phase at a particular point exceeds a predetermined threshold indicative of a phase wrap, unwrapping the phase by adjusting the phase at said particular point by $2\pi$, the phase unwrapping for all the spatial points resulting in phase unwrapped signals $P(r)_1$ and $P(r)_2$;

H) subtracting $P(r)_1$ from $P(r)_2$ to obtain a phase difference signal $P(r)_D$; and I) acquiring a base frequency distribution, $F_B$, in the gradient direction by calculating $F_B=(P(r)_D/(t_2-t_1))$ for each of said spatial points.

2. A method according to claim 1 further comprising performing each of steps A) through I) for a plurality of gradient directions.

3. A method according to claim 1 wherein the method is also a method of shimming a magnet by providing electrical currents through a plurality of magnetic shim coils, the electrical currents being selected such that the magnetic fields generated by the shim coils compensate for the determined inhomogeneities in the magnetic field of the magnet.

4. A method according to claim 3 further comprising performing each of steps A) through I) for a plurality of gradient directions.

5. A method according to claim 1 wherein step H) is performed before step G), such that the phase difference signal $P_D(r)$ is obtained prior to unwrapping the phase.

6. A method according to claim 1 wherein the method is also a method of acquiring a shim frequency distribution in the sample as a result of a magnetic field generated by a shim coil, the method further comprising the steps of:

J) passing a first current through a shim coil;

K) repeating steps A) through I) to acquire a shim-base frequency distribution, $F_{SB}$, the shim-base frequency distribution being the base frequency distribution $F_B$ acquired while the current is passed through the shim coil; and L) determining the shim frequency distribution by subtracting the base frequency distribution, $F_S$, from the shim-base frequency distribution, $F_{SB}$.

7. A method according to claim 6 further comprising repeating steps J) through L) for each of a plurality of shim coils.

8. A method according to claim 7 wherein each execution of steps A) through I) comprises executing steps A) through I) for a plurality of gradient directions so as to acquire a plurality of projections, each projection being a frequency distribution acquired in one of said gradient directions, the method also being a method for shimming the magnetic field of the magnet and further comprising the steps of:

M) calculating the appropriate shim currents for compensating for inhomogeneities of the magnetic field of the magnet by calculating values for a vector v which minimizes the term $A.v-b)^2$, where A is a matrix of dimension c×m, containing c of said shim frequency distributions each having m data points, and b is a vector containing m data points from the projections of the base frequency distribution $F_B$, said data points corresponding spatially to the datapoints of the shim maps; and N) applying the shim currents to the appropriate shim coils.

9. A method of determining the frequency signal for a particular spatial point in the sample volume of an NMR apparatus, the method comprising:

measuring the time-domain free induction decay signal of the spatial point at a plurality times during a decay period;

determining the phase of the free induction decay signal of said spatial point as a function of time; and taking the derivative of said phase as a function of time, and averaging said derivative over a predetermined time period.

10. A method according to claim 9 further comprising detecting anomalies in the phase signal, and discarding values of said derivative which correspond in time to said anomalies.

11. A method according to claim 9 further comprising detecting anomalies in said derivative, and discarding values of said derivative from said averaging which correspond in time to said anomalies.

* * * * *